(12) United States Patent
Reinmuth et al.

(10) Patent No.: US 10,555,090 B2
(45) Date of Patent: Feb. 4, 2020

(54) MICROPHONE WITH ENCAPSULATED MOVING ELECTRODE

(71) Applicants: Akustica, Inc., Pittsburgh, PA (US); Robert Bosch GmbH, Stuttgart (DE)

(72) Inventors: Jochen Reinmuth, Reutlingen (DE); Vijaye Rajaraman, Reutlingen (DE); Daniel Meisel, Pittsburgh, PA (US); Bernhard Gehl, Wannweil (DE)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/000,593

(22) Filed: Jun. 5, 2018

(65) Prior Publication Data

US 2018/0352341 A1    Dec. 6, 2018

Related U.S. Application Data

(60) Provisional application No. 62/515,157, filed on Jun. 5, 2017.

(51) Int. Cl.
*B81C 1/00* (2006.01)
*H04R 1/28* (2006.01)
*H04R 19/04* (2006.01)
*H04R 19/00* (2006.01)
*H04R 7/04* (2006.01)

(52) U.S. Cl.
CPC .............. *H04R 19/04* (2013.01); *H04R 7/04* (2013.01); *H04R 19/005* (2013.01); *B81B 2201/0257* (2013.01); *H04R 2201/003* (2013.01)

(58) Field of Classification Search
CPC ........ H04R 19/04; H04R 19/005; H04R 3/06; H04R 2201/003; H04R 1/04; H04R 2499/15; H04R 1/28; B81B 7/0061; B81B 2203/0315; B81C 1/00134; G01C 19/5762
USPC .................. 381/111, 113, 92, 58, 95, 337
See application file for complete search history.

(56) References Cited

U.S. PATENT DOCUMENTS

| 2011/0147864 A1 | 6/2011 | Kramer et al. |
| 2014/0294218 A1* | 10/2014 | Suvanto ................. H04M 1/03 381/337 |
| 2015/0175404 A1 | 6/2015 | Jenkins et al. |
| 2016/0066099 A1 | 3/2016 | Dehe et al. |

(Continued)

FOREIGN PATENT DOCUMENTS

| KR | 20130039504 A | 4/2013 |
| KR | 20170045297 A | 4/2017 |

OTHER PUBLICATIONS

International Search Report and Written Opinion corresponding to International Patent Application No. PCT/US2018/036112 (12 pages).

*Primary Examiner* — Vivian C Chin
*Assistant Examiner* — Ubachukwu A Odunukwe
(74) *Attorney, Agent, or Firm* — Maginot, Moore & Beck LLP (57) ABSTRACT

A MEMS microphone system with encapsulated movable electrode is provided. The MEMS microphone system comprises a MEMS sensor having an access channel, a plug, and first and second members. The access channel configured to receive the plug is formed on at least one of the first and second member. A vacuum having a pressure different from a pressure outside the MEMS sensor is formed between the first and second members.

20 Claims, 7 Drawing Sheets

(56) References Cited

U.S. PATENT DOCUMENTS

2017/0247246 A1* 8/2017 Schelling .............. B81B 3/0086
2018/0074090 A1* 3/2018 Boysel ............... G01C 19/5762

* cited by examiner

MICROPHONE WITH ENCAPSULATED MOVING ELECTRODE

FIELD

This disclosure relates generally to microelectromechanical system (MEMS) acoustic transducers and, more particularly, to a microphone with encapsulated moving electrode.

BACKGROUND

Unless otherwise indicated herein, the materials described in this section are not prior art to the claims in this application and are not admitted to the prior art by inclusion in this section.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

A Microelectromechanical System (MEMS) microphone system comprises a package housing having a cavity is provided. The MEMS microphone system further comprises a MEMS sensor is disposed within the cavity of the package housing. The MEMS sensor comprises a substrate, a first member and a second member spaced apart from the first member are arranged above the substrate, a plug, and an access access channel formed on at least one of the first or the second member, the access channel is configured to receive the plug. A vacuum formed between the first and second members, the vacuum having a pressure different from the cavity. An assembly comprises a plurality of connections and a plurality of posts is formed between the first and second members. The assembly further comprises a coupling configured to stiffening the first and second members is located on a central portion of the first and second members. The MEMS sensor further comprises an electrode assembly having a movable electrode and a stationary electrode, wherein the movable electrode formed between the first and second members is mechanically coupled to at least one of the first or second member. The movable electrode overlaps with the stationary electrode. The electrode assembly further comprises a stationary counter electrode. The stationary counter electrode is disposed above the movable electrode and formed part of at least one of the first or the second member.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

The disclosure is a microphone system for a client machine. Within the client machine are several other electronic components, such as sensor devices, speakers, graphical processor units, computer processor units, host systems, MEMS microphones, and any suitable computer implemented devices either directly or indirectly coupled to the microphone system. The client machine may be a personal computer or desktop computer, a laptop, a cellular or smart phone, a tablet, a personal digital assistant (PDA), a gaming console, an audio device, a video device, an entertainment device such as a television, a vehicle infotainment, a wearable device, an entertainment or infotainment remote control, a thin client system, a thick client system, or the like. Other suitable client machines regardless of size, mobility, or configuration may be suggested to include any number of microphone system.

The microphone system includes a package housing or an enclosure for housing any number of sensor devices/dies, internal components, or combination thereof. The sensor devices/dies may be such as MEMS transducers, speakers, receivers, microphones, pressure sensors, thermal sensors, optical sensors, imaging sensors, chemical sensors, gyroscopes, inertial sensors, humidity sensors, accelerometers, gas sensors, environmental sensors, motion sensors, navigation sensors, vital sensors, tunnel magnetoresistive (TMR) sensors, proximity sensors, bolometers, or combination thereof. The microphones may be electret microphones, capacitive microphones, graphene microphones, piezoelectric microphones, silicon microphones, optical microphones, or any suitable acoustic microphones.

Figure 1:
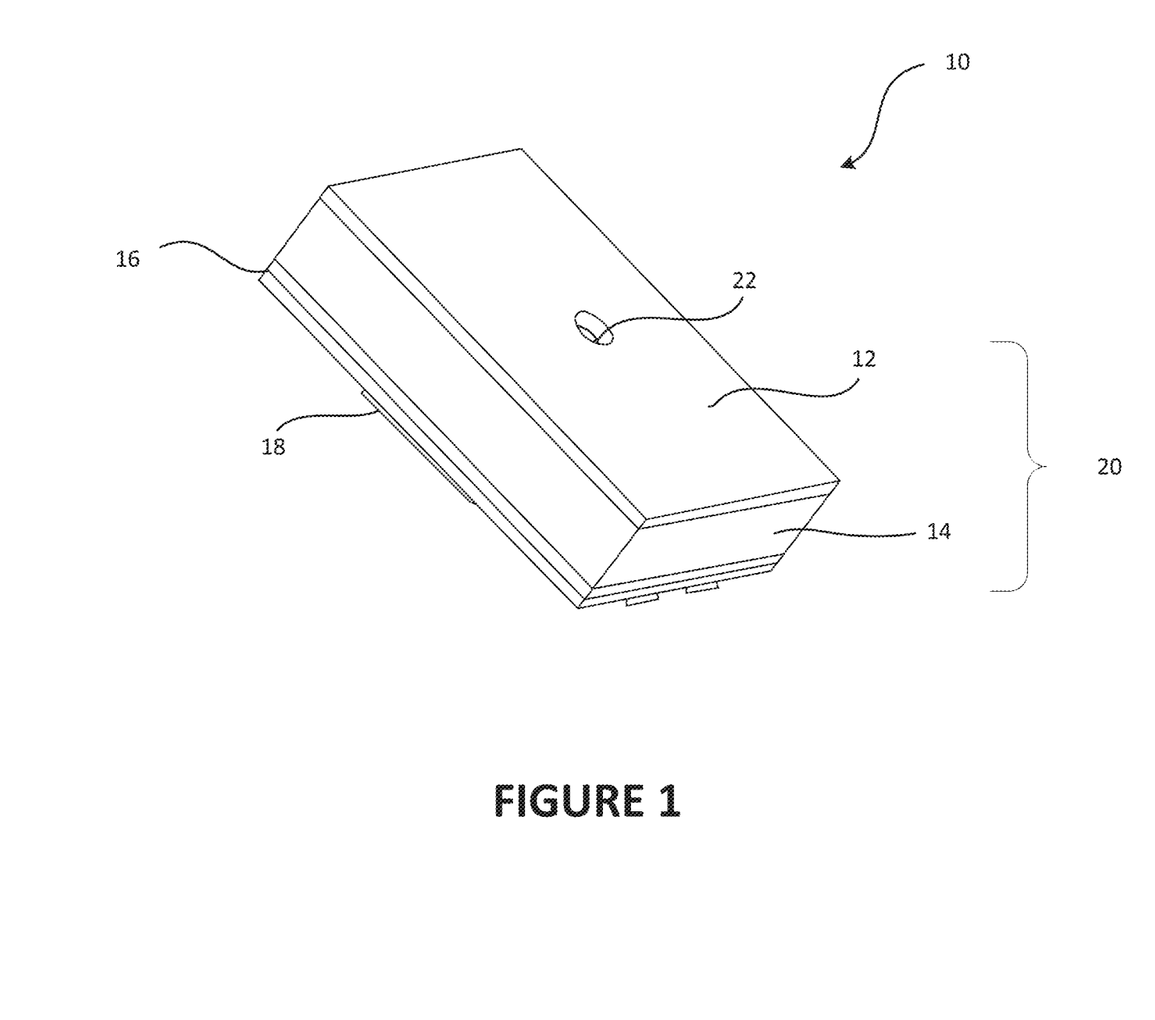
FIG. 1 is a perspective view of a microphone system in accordance with a described embodiments of a disclosure.

FIG. 1 is a perspective view of a microphone system 10 according to an embodiment of the disclosure. The MEMS microphone system 10 includes a package housing 20 having a lid 12, a spacer 14, and a substrate 16 attached to the spacer 14 by any suitable methods of attachment. More than one sensor device/die may be mounted within the microphone system 10. The sensor devices/dies may be MEMS transducers, speakers, receivers, microphones, pressure sensors, thermal sensors, optical sensors, imaging sensors, chemical sensors, gyroscopes, humidity sensors, inertial sensors, vital sensors, TMR sensors, accelerometers, gas sensors, environmental sensors, motion sensors, navigation sensors, proximity sensors, bolometers, or combination thereof. Optional components such as ASICs, integrated circuits, processors, controllers, energy storage devices, actuators, sensor circuits or any suitable circuitry may be mounted within the microphone system 10. Depending on the application, any number of opening 22 such as a port or a passageway for receiving attributes from an environment may be formed on any location of the package housing 20 by etching, piercing, drilling, punching, or any suitable methods. For example, the opening 22 may be formed on the lid 12, the substrate 16, or the spacer 14. In some embodiments, the opening 22 may be formed on multiple locations of the package housing 20. The attributes may be acoustic signal, pressure signal, optical signal, gas signal, and any suitable signal. An optional barrier may be formed within the opening 22. The barrier is configured and functioned as a filter to remove debris, contamination, particles, vapor, fluid, or the like. In some embodiments, the barrier may formed on the outer surface of the housing 20 to cover the opening 22 so that debris, contamination, particles, or the like cannot penetrate into the housing. In yet another embodiments, the barrier may be formed below the opening 22 in which a portion of the barrier is attached to the inner surface of the housing 20 for filtering or removing debris, contamination, particles, or the like. In yet embodiments, the barrier may be fabricated directly onto the movable member such as a diaphragm. In yet another embodiment, the barrier is formed as a layered film or a layered material and may either integrated into the housing 20 during fabrication, or disposed on the outer or inner surface of the housing 20. Although one barrier is described, multiple layers of barrier or any suitable number of barrier may be implemented on the MEMS package, depending on the application. The barrier not only functions as the particle removal while exposed to the environment via the opening 22, the barrier can also serve other purposes such as a shock absorber, or a vibration damper, or combination thereof. Although the microphone system 10 as depicted comprises a multi-structure package housing 20, various aspects and configurations either in a single structure package housing, a two piece structure package housing, or multi-structure package housing may be used to encapsulate at least one internal component. As an example, the lid 12 and the spacer 14 may be formed as a single structure, defines a cover or a cap. One or more bonding pads 18 may be formed on the substrate 16, the lid 12, the spacer 14, or multiple locations of the package housing 20 by any suitable method. Once bonding pads 18 are introduced, the microphone system 10 can be easily mounted to an external printed circuit board or another support member of the client machine. In some embodiments, the package housing further includes an interposer coupled the cover 12 to either the spacer 14 or the substrate 16.

Figure 2A:
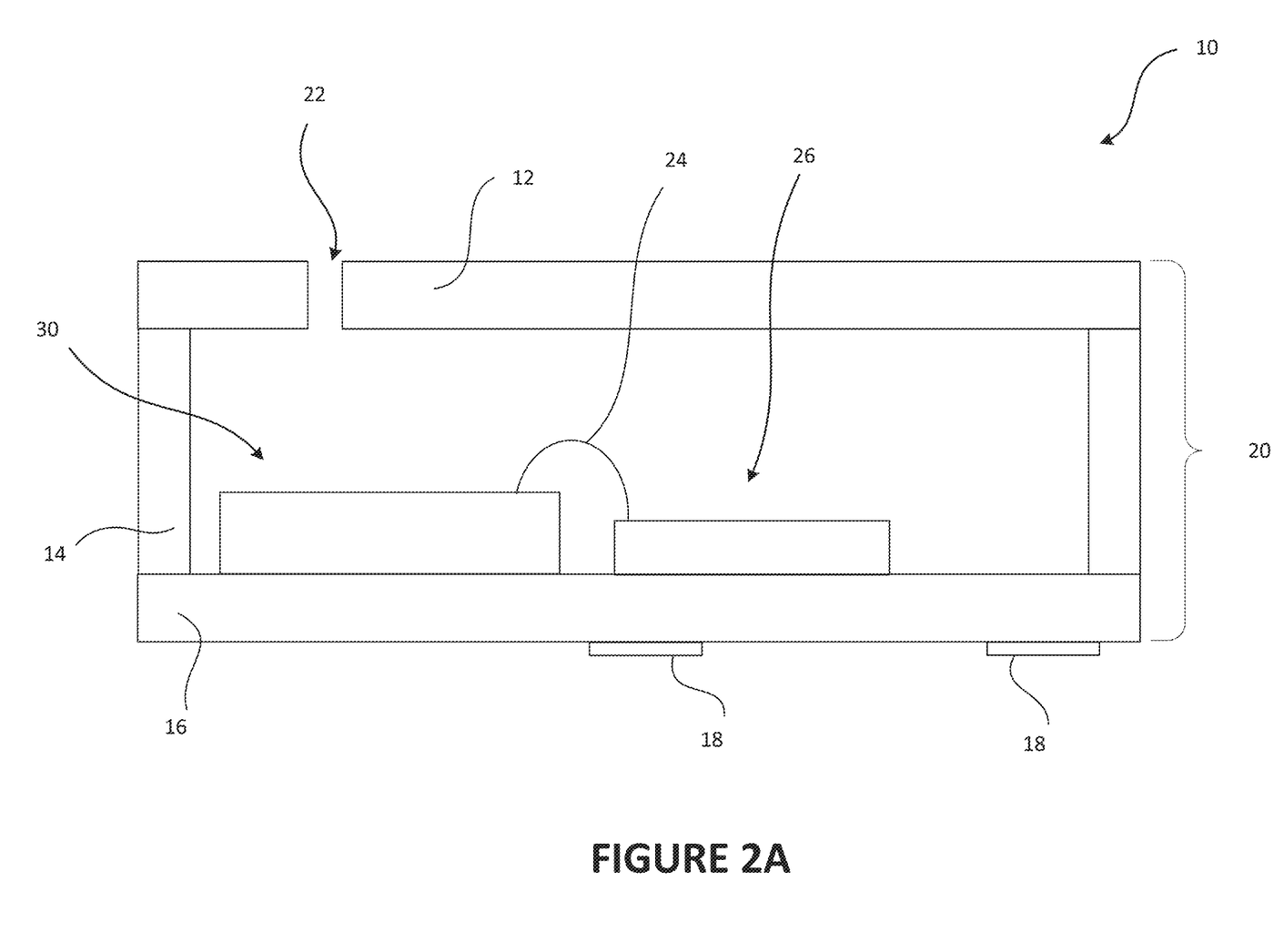
FIGS. 2A-2C are cross-sectional views of the microphone system of FIG. 1 with various opening configurations in accordance with a described embodiment of the disclosure.
Figure 2B:
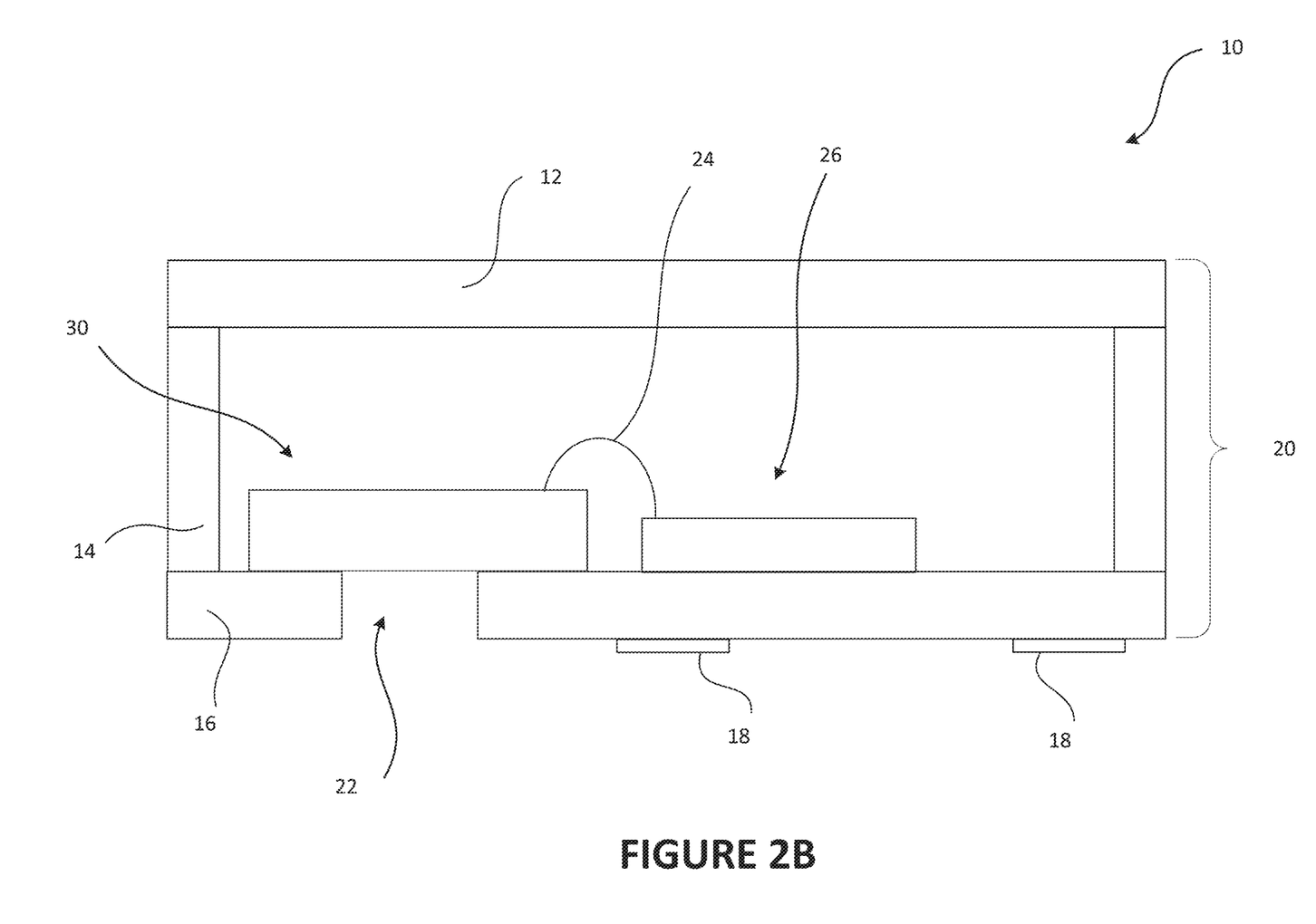
Figure 2C:
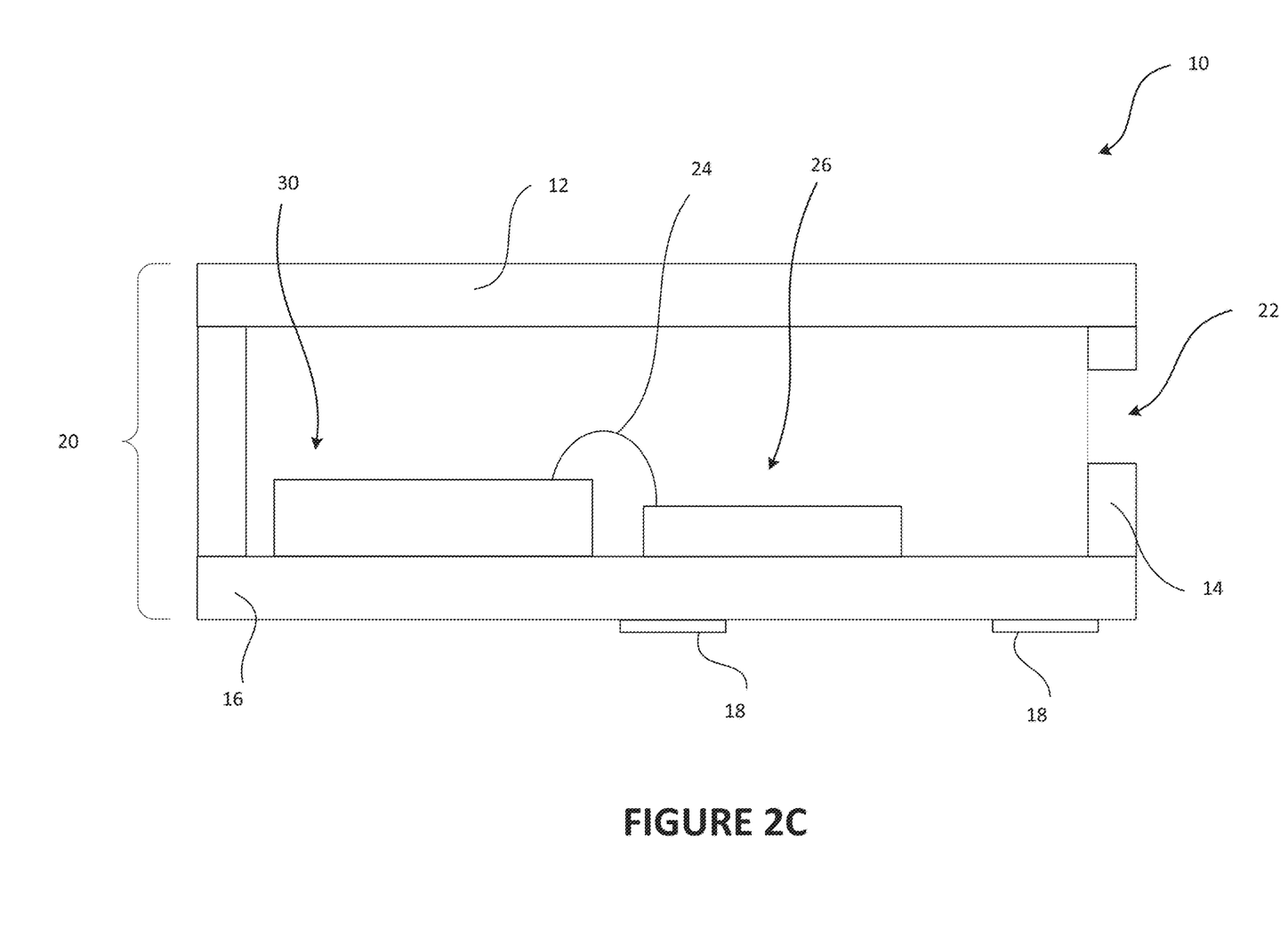

FIGS. 2A-2C illustrate cross-sectional view of the microphone systems 10 of FIG. 1 having various opening configuration formed on different location of the packaging housing 20 in accordance with a described embodiment of the disclosure. Although one opening 22 is illustrated in each figures, any suitable number of opening 22 in various sizes and geometry may be formed by any methods on the packaging housing 20. The microphone system 10 includes a sensor device/die 30 and a component 26 mounted within any location of the package housing 20. The opening 22 formed on at least one location of the package housing 20 that is adjacent to at least one of the sensor device 30 or the component 26 receive attributes or stimuli such as acoustic signals from external environment. A connection link 24 may be introduced to communicatively couple the sensor device 30 to the component 26. The connection link 24 may be wire bond, solder-bump, solder microbump, solder ball, or any suitable connectors. In some embodiments, the connection link 24 may be a wireless communication link and the sensor device 30 is communicatively coupled to the component 26 with built-in interfaces formed in both sensor device 30 and the component 26. The wireless communicative link, for example, may be WiFi, near field communication (NFC), Zigbee, Smart WiFi, Bluetooth (BT) Qi wireless communication, ultra-wide band (UWB), cellular protocol frequency, radio frequency, or any suitable communication link. Depending on the applications, any number of sensor devices 30, components 26, or connection links 24 between the sensor devices and the components may be used. Although side-by-side configuration of the component 26 and the sensor device 30 is illustrated in FIG. 1, any suitable configurations may be possible. For example, the sensor device 30 may be placed or mounted on top of the component 26 to form a stacked configuration. In another example, the sensor device 30 may be mounted in a hole formed within the component 26 configured to receive the sensor device to form a surrounded configuration.

Figure 3:
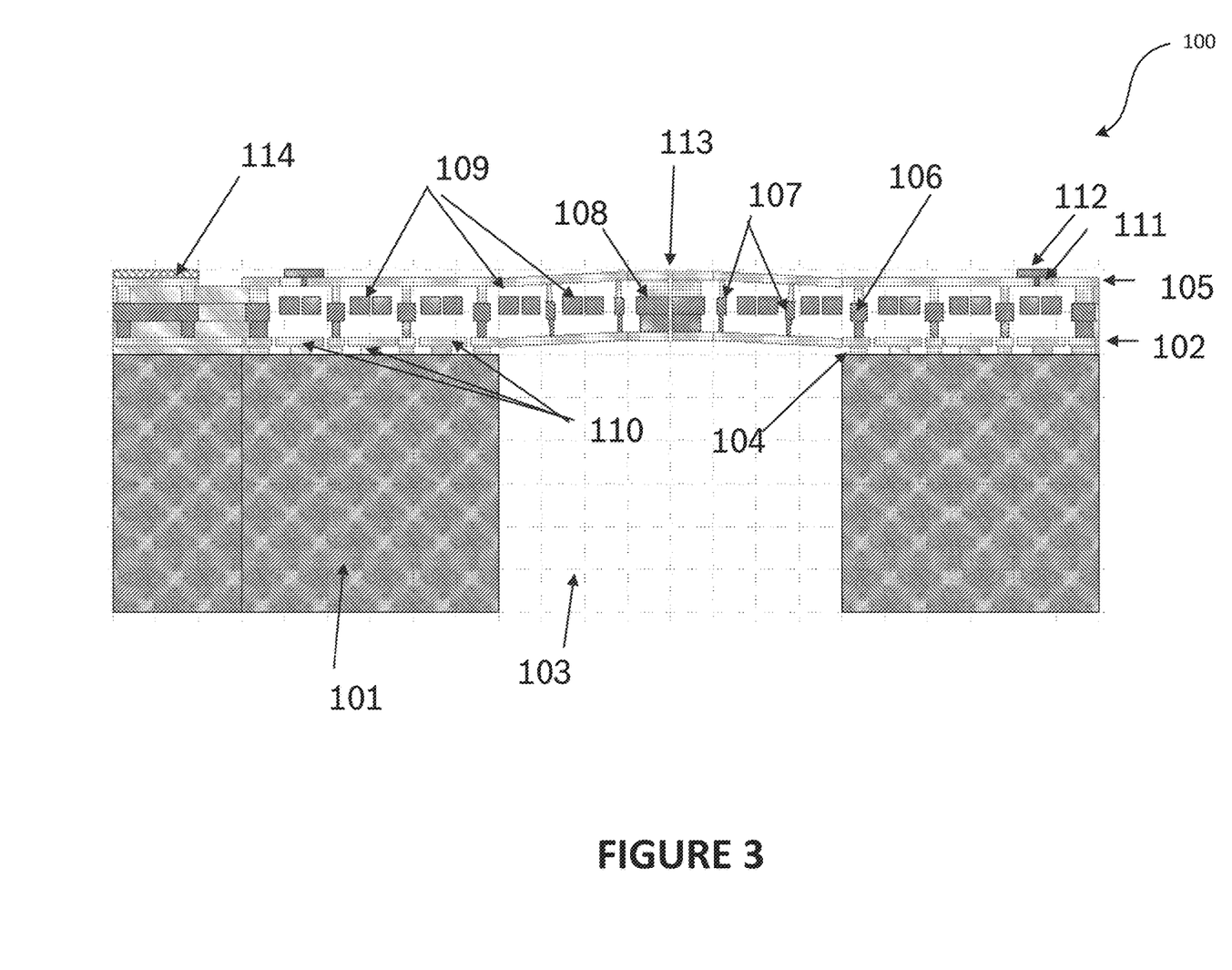
FIG. 3 is a cross-sectional view of a microphone according to a described embodiment of the disclosure.

FIG. 3 illustrates a cross-sectional view of an embodiment of a microphone die 100 mounted within the microphone system 10 of FIG. 1. The microphone die 100 comprises a substrate 101 including a cavity or a substrate hole 103 and a first membrane 102 is arranged above a substrate 101. In one embodiment, the membrane 102 is electrically connected to the substrate 104. In another embodiment, the membrane 102 is electrically isolated from the substrate 104 by any suitable methods of technology. The microphone die 100 further comprises a second membrane 105 connected to the substrate 101 by any suitable method of attachment. In between the first and second membrane 102, 105, a plurality of connections 106 and posts 107 are provided. The posts 107 coupled the first and second membrane 102, 105 by any suitable methods. In one embodiment, the thickness of the posts 107 are either slim or thin to limit stiffening of the two membranes 102, 105. Adjacent to a central portion of the microphone is a coupling 108 which provide stiffness to the two membranes 102, 105. As illustrated, a movable electrode 109 is attached to at least one membrane 102, 105. The movable electrode 109 overhangs beyond the membrane 102, 105 and overlaps with at least one stationary electrode 110 which is attached to the substrate 101. In another embodiment, the moving electrode is arranged between two membranes. The moving electrode is mechanically coupled with a center region of at least one membrane. In some embodiments, the electrode is electrically non-conductively attached to the membrane. The movable electrode protrudes beyond the membranes. The displacement of the movable electrode is measured in a region outside the membranes via counter electrodes which are fixed to the substrate. The area next to the membrane thereby can efficiently be used as detection area. Between the membranes and between the movable and stationary electrodes, for example, a vacuum, a low pressure, or a pressure different from the surrounding is enclosed. Thereby a small damping can be achieved despite the high capacitive signal. Many connecting trusses/beams are foreseen in order to enable the use of very compliant membranes which do not collapse despite the vacuum between the membranes. The connecting trusses/beams are slim such that reduced or minimum stiffening of the two membranes results. Holes are foreseen in the movable electrode through which the connecting beam reach such that the connecting beams and the movable electrode are not coupled to each other. The two membranes can be stiffened in the center which enables the use of lager membranes which bend only in a ring-shaped region at the edge. Thereby larger areas can be spanned for the same single membrane thickness and by this the back volume of a microphone can be optimized for example by increasing footprint of the back volume. The openings through which the vacuum between the membranes and the movable and static electrodes is produced are located preferably at the substrate region near to or above the stationary electrodes and are not required to being located in the membrane. The movable electrode is attached to one or to both membranes through an electrically isolating material like an oxide layer. By electrically separating the substrate potential from the potential of the movable electrode simpler circuits can be used for the read out. In addition to that the parasitic capacitance is reduced considerably which facilitates a much more improved read out of the signal. The electrical connection of the movable electrode to the periphery can be carried out by a very compliant/soft spring structure which for example is realized in the layer of the movable membrane. At least one access channel 111 is formed on the membrane 105. The access channel 111 is configured to either release, encapsulate, or create a defined pressure, preferably a vacuum, formed in the cavity between the two membranes 102, 105 and the movable and the stationary electrodes 109, 110. The access channel 111 is closed by inserting a plug 112 there through. In some embodiments, the access channel 111 is located outside the two membranes without interfering with the mechanical properties of the membranes. In order to achieve a pressure equalization during the operation of the microphone between the side facing the sound and the side facing the back volume little through holes or slits 113 are provided in the membranes 102, 105. In one embodiment, the stationary electrode 110 is formed on the same layer/plane and by using the same material as the lower membrane. In another embodiment, an additional layer can be placed above the stationary electrode 110. This layer is then partially released and is extended into the region of the membrane in order to use at least a portion of the membrane area for signal detection. The isolation of the stationary electrode can be achieved by an Oxide layer, a Nitride layer, or any suitable material. The signal from the different electrodes can be routed to the outside by any suitable methods.

In some embodiments, during fabrication, different layer depositions and structuring of Polysilicon layers and Oxide layers (or additional Nitride layers) may be formed on the Silicon substrate. The Oxide layers used as sacrificial layer can be removed by a HF gas phase etch process, for example. The sacrificial layer is etched to form the access holes for the creation of the vacuum. In order to efficiently remove the sacrificial layer in the membrane region and in order to use only access holes outside the membrane region, etch channels are implemented for the etching of the sacrificial layer in the region between the two membranes to keep the duration of the process step of removing the sacrificial layer within reasonable limits. The etch channels may include optional cavities, depending on a desired application. The microphone 100 is provided to allow for an electrode configuration independent from the membrane geometry. The microphone 100 is also provided to allow very large and sensitive membrane geometries. A differential read out coupled to the microphone allow for simple static electrode. The microphone 100 is provided for the moving electrode to be on a different potential than the substrate in order to enable a simple evaluation of the signal. The membrane operable at substrate potential prevents short circuits between substrate and membrane. Furthermore, a low pressure between the membranes without the need of encapsulation of openings being located in the membrane is provided.

Figure 4:
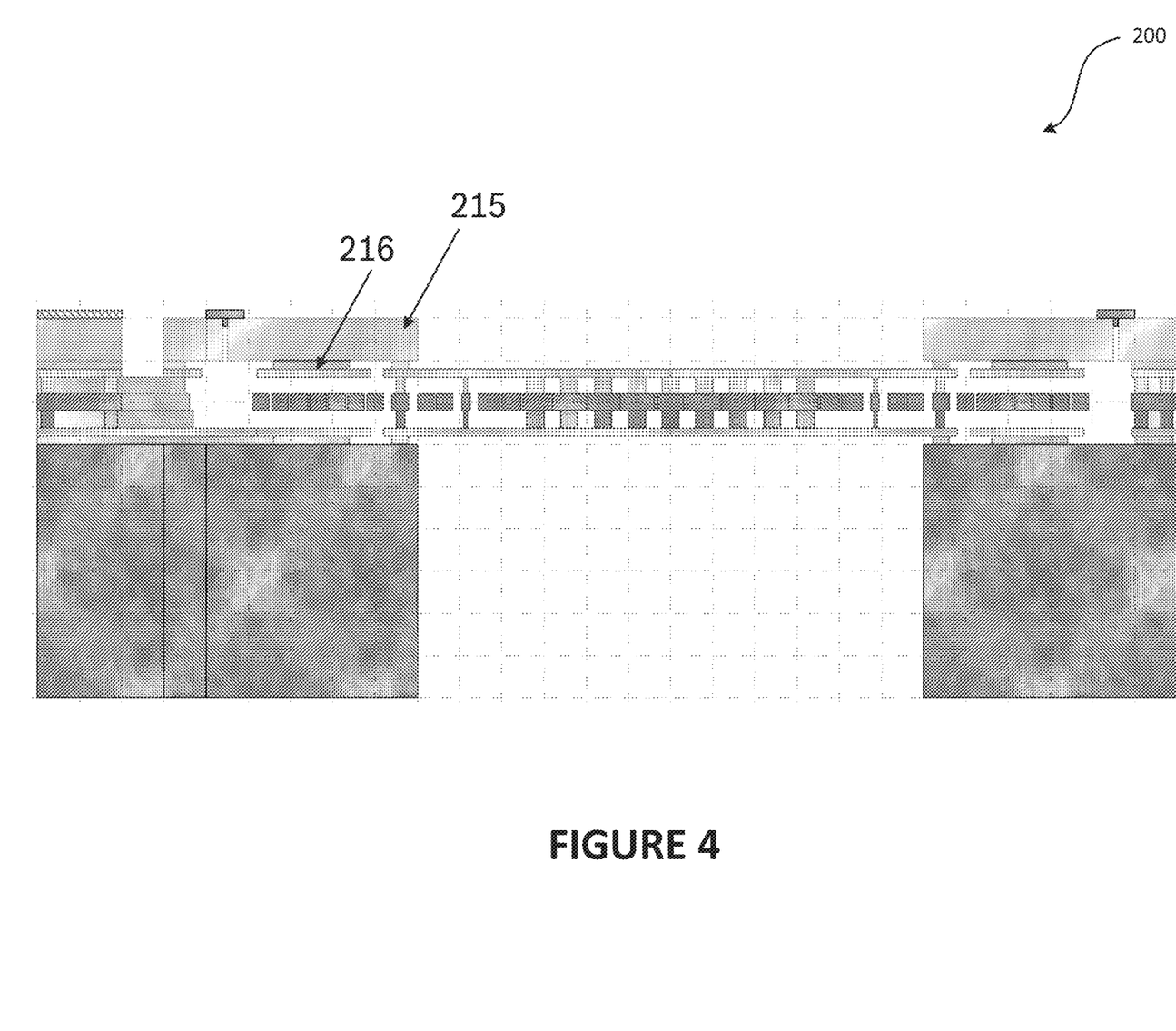
FIG. 4 is a cross-sectional view of a microphone according to a described embodiment of the disclosure.
Figure 5:
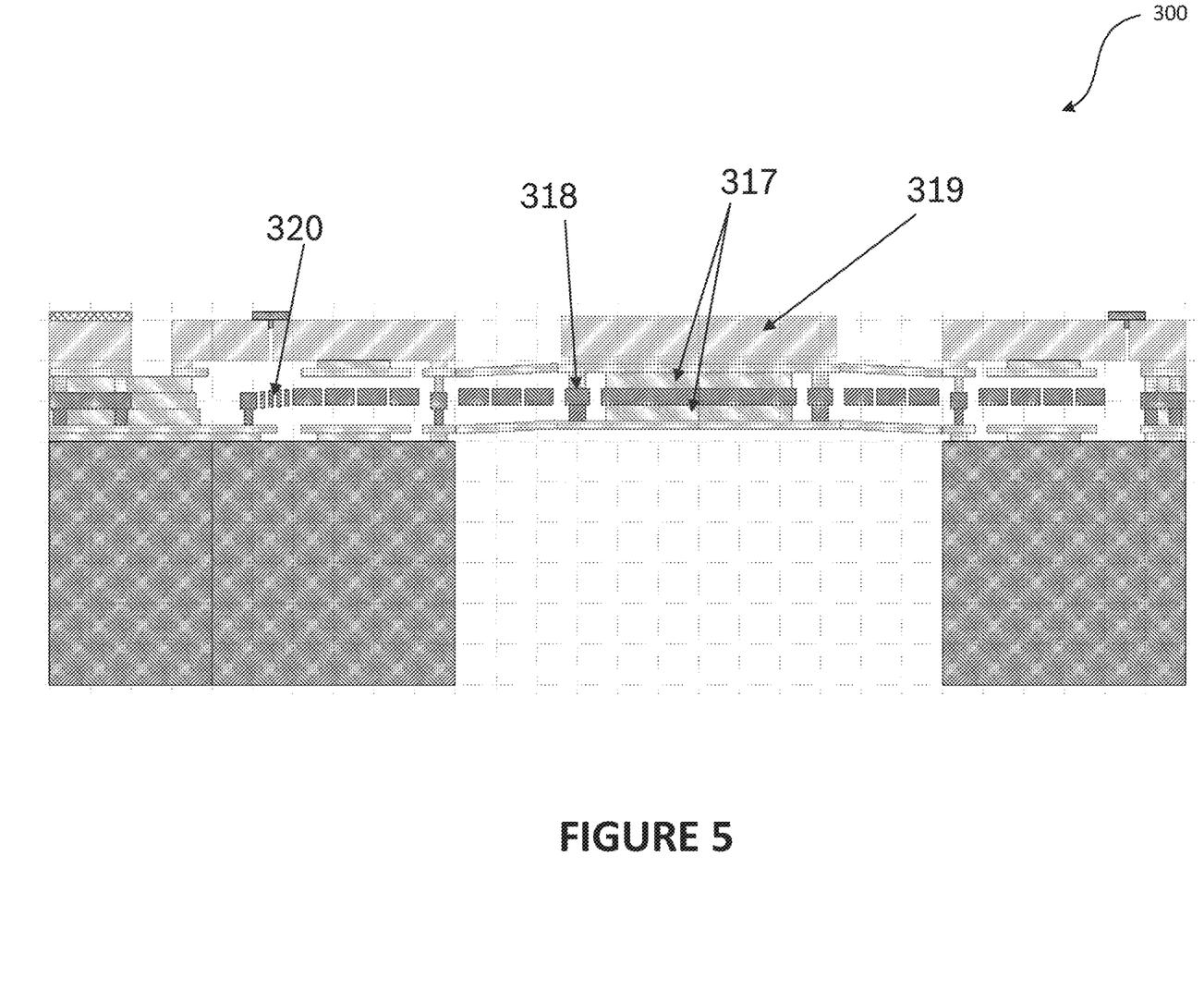
FIG. 5 is a cross-sectional view of a microphone according to a described embodiment of the disclosure.

FIG. 4 illustrates a cross-sectional view of an embodiment of a microphone die 200 mounted within the microphone system 10 of FIG. 1. Unlike from FIG. 3, an additional layer which is an upper final layer 215 is provided. This layer allows for a more robust microphone. Another stationary counter electrode 216 may be formed above the movable electrode. In one embodiment, the upper stationary electrode is formed as the same layer as the upper membrane. The signal may be read out in a fully differential way. In addition to that the center portion of the membrane is stiffened in this example in order to realize a larger membrane with larger back volume and by this gaining more sensitivity FIG. 5 illustrates a cross-sectional view of an embodiment of a microphone die 300 mounted within the microphone system 10 of FIG. 1. Unlike from FIG. 4, the movable electrode is mechanically coupled to the membranes via for example oxide layers 317 while still being electrically isolated from the membranes. It is advantageous that the mechanical stiffening in the center of the membrane can be defined independent from the mechanical coupling of the movable electrode to the membranes via posts 318 which can be positioned accurately. The Oxide edges vary largely due to the inaccuracy of the sacrificial layer etch process which would result in an increased inaccuracy of the microphone sensitivity if no additional structures would be applied for the mechanical stiffening. For example, the center region of the membrane is stiffened by adding the upper cover layer 319 which also enables larger diameter membranes. In this example the electrical signal is guided to the outside via a very soft spring 320 which is realized in the layer/plane of the movable electrode.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the sprit and scope of this disclosure.

While the patent has been described with reference to various embodiments, it will be understood that these embodiments are illustrative and that the scope of the disclosure is not limited to them. Many variations, modifications, additions, and improvements are possible. More generally, embodiments in accordance with the patent have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A Microelectromechanical System (MEMS) microphone system comprising:
a package housing having a first cavity; and
a MEMS sensor disposed within the cavity of the package housing, the MEMS sensor comprising:
a substrate;
a first movable membrane and a second movable membrane spaced apart from the first movable membrane, wherein the first and second movable membranes are arranged above the substrate;
a plug; and
an access channel to a second cavity located between the first and second movable membranes and formed through at least one of the first movable membrane or the second movable membrane, the access channel configured to receive at least a portion of the plug therein.

2. The MEMS microphone system of claim 1, the MEMS sensor further comprising a vacuum formed in the second cavity, the vacuum having a pressure different from the first cavity.

3. The MEMS microphone system of claim 2 further comprising an assembly formed in the second cavity.

4. The MEMS microphone system of claim 3, the assembly comprising:
a plurality of connections; and
a plurality of posts.

5. The MEMS microphone system of claim 4, the assembly further comprising a coupling configured to stiffen the first and second movable membranes.

6. The MEMS microphone system of claim 5 wherein the first and second movable membranes comprise respective central portions above a hole in the substrate portion and the coupling is located between the respective central portions.

7. The MEMS microphone system of claim 2, the MEMS sensor further comprising an electrode assembly having a movable electrode and a stationary electrode.

8. The MEMS microphone system of claim 7 wherein the movable electrode is mechanically coupled to at least one of the first movable membrane and the second movable membrane.

9. The MEMS microphone system of claim 8 wherein the movable electrode overlaps the stationary electrode.

10. The MEMS microphone system of claim 7 wherein the movable electrode is formed between the first and second movable membranes.

11. The MEMS microphone system of claim 10 wherein the first and second movable membranes comprise a respective central portion above a hole in the substrate and the movable electrode is located between the respective central portions.

12. The MEMS microphone system of claim 7, the electrode assembly further comprising a stationary counter electrode.

13. The MEMS microphone system of claim 12 wherein the stationary counter electrode is disposed above the movable electrode.

14. The MEMS microphone system of claim 12 wherein the stationary counter electrode forms part of at least one of the first or the second movable membrane.

15. A Microelectromechanical System (MEMS) microphone comprising:
a substrate;
a first movable membrane and a second movable membrane spaced apart from the first movable membrane, wherein the first and second movable membranes are arranged above the substrate;
a plug; and
an access channel formed through at least one of the first or the second movable membranes, the access channel opening to a cavity located between the first and second movable membranes and configured to receive at least a portion of the plug therein.

16. The MEMS microphone of claim 15 further comprising a vacuum formed in the cavity, the vacuum having a pressure.

17. The MEMS microphone of claim 16 wherein the pressure of the vacuum is different from a pressure outside the MEMS microphone.

18. The MEMS microphone of claim 15 further comprising an assembly formed in the cavity.

19. The MEMS microphone system of claim 18, the assembly comprising:
a plurality of connections; and
a plurality of posts.

20. The MEMS microphone system of claim 18, the assembly comprising a coupling configured to stiffen the first and second movable membranes at allocation directly above a hole in the substrate.

* * * * *

UNITED STATES PATENT AND TRADEMARK OFFICE
CERTIFICATE OF CORRECTION

PATENT NO.        : 10,555,090 B2
APPLICATION NO.   : 16/000593
DATED             : February 4, 2020
INVENTOR(S)       : Jochen Reinmuth et al.

It is certified that error appears in the above-identified patent and that said Letters Patent is hereby corrected as shown below:

In the Claims

In Claim 6, at Column 7, Line 19, delete the word "portion" between the words "substrate" and "and".

Signed and Sealed this
Nineteenth Day of May, 2020

Andrei Iancu
*Director of the United States Patent and Trademark Office*